United States Patent [19]
Grundler

[11] 4,158,151
[45] Jun. 12, 1979

[54] SEMICONDUCTOR LASER MODULATING CIRCUIT

[75] Inventor: Donald F. Grundler, Ridgecrest, Calif.

[73] Assignee: The United States of America as represented by the Secretary of the Navy, Washington, D.C.

[21] Appl. No.: 812,300

[22] Filed: Jul. 1, 1977

[51] Int. Cl.² ............................................. H03K 17/00
[52] U.S. Cl. ................................. 307/312; 307/252 L; 307/252 M; 307/253
[58] Field of Search ................... 307/312, 252 L, 305; 328/67; 331/94.5 PE, 94.5 S; 315/340

[56] References Cited
U.S. PATENT DOCUMENTS

| | | | |
|---|---|---|---|
| 2,595,301 | 5/1952 | Sager | 328/67 |
| 3,135,876 | 6/1964 | Embree et al. | 328/67 |
| 3,521,145 | 7/1970 | Toulemonde et al. | 307/252 L |
| 3,943,453 | 3/1976 | Melchior | 328/67 |

Primary Examiner—Stanley D. Miller, Jr.
Assistant Examiner—B. P. Davis
Attorney, Agent, or Firm—R. S. Sciascia; W. Thom Skeer; John H. Lynn

[57] ABSTRACT

By using two or more series connected silicon controlled rectifiers a laser modulator is created which provides higher current, faster rise time and narrower pulses than can be provided by existing single or multiple silicon controlled rectifier circuits. In an example circuit using two such rectifiers, the first is gate triggered and the second is turned on by a rapid voltage increase across its anode and cathode.

5 Claims, 4 Drawing Figures

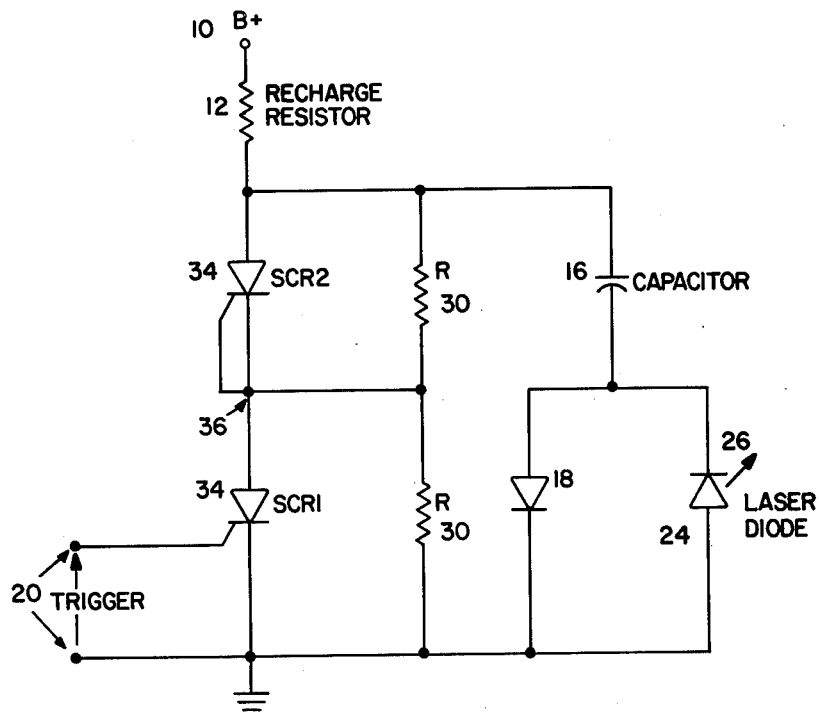

SEMICONDUCTOR LASER MODULATING CIRCUIT

BACKGROUND OF THE INVENTION

This invention relates to modulated circuits. In particular it relates to laser modulators of laser diodes; and, even more specifically it relates to laser modulators of laser diodes capable of providing high current, fast rise time, narrow pulses.

Previous circuits that were used to provide these results were limited by the fact that with the use of silicon controlled rectifiers, SCRs, the fastest SCRs available had low breakdown voltages. To increase the peak pulse current of such a circuit without increasing the rise time or pulse width required increasing the supply voltage. However, supply voltage could not be increased beyond the breakdown voltage of the SCR. Alternate circuits which could avoid the difficulty of breakdown voltage ran into the problem that by using multiple SCRs the turn on time was limited by the turn on time of the slower SCR. The overall turn on time and rise time were slower than single SCR circuits which had breakdown voltage limitations.

The need for high current is so the laser diode is able to provide a stronger signal. The need for narrow pulses is to prevent over heating. The requirement for fast rise time is to allow electronic range gating by use of a laser diode. Without a fast rise time it is impossible to use laser diodes for electronic ranging of targets. Electronic ranging as used here refers to using the time of return of the leading edge of a pulse from a target to determine the range to the target, as in radar systems.

SUMMARY OF THE INVENTION

A relatively high voltage modulating circuit is developed to provide controlled current pulses to a given circuit. For purposes of illustration the circuit is shown and described driving a laser diode. It will hereafter be referred to as a laser modulator, however, it is equally applicable to any similarly modulated circuit.

A laser modulator circuit using two or more SCRs avoids breakdown voltage problems encountered in single SCR triggered circuits. However, only one of the SCRs is triggered by a timing pulse. The second SCR is triggered or turned on by the breakdown voltage induced across its terminals when the first SCR is turned on by the triggering pulse. The voltage rapidly applied across the cathode and anode of the second SCR results in a large rate of change of voltage with respect to time, dv/dt. This causes the turn on time of the second SCR to be very fast.

An object of the invention is to provide a laser modulator circuit for laser diodes which provides high current, fast rise time, and narrow pulses so that the laser diode can be used for electronic range gating.

DESCRIPTION OF THE PREFERRED EMBODIMENT

Figure 1:
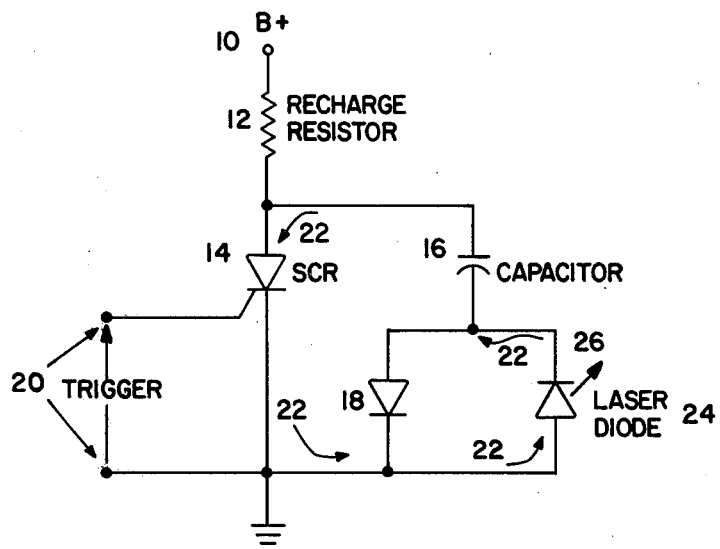
FIG. 1 is a prior art circuit using a single SCR.

FIG. 1 is a common circuit used for modulating laser diodes. Voltage source 10, denoted by the B+ mark, provides a current flow through resistor 12, labeled recharge resistor. When SCR 14 is off, capacitor 16, which is tied to ground through diode 18, charges up. When capacitor 16 fully charged, current flow ceases and the circuit is ready to discharge. When a trigger signal is provided across terminals 20, SCR 14 is turned on and acts as a short in the circuit. Capacitor 16 can now discharge along the path indicated by arrows 22. This path passes through laser diode 24, and the current flow causes light to be emitted as indicated by arrow 26. In order to increase the peak pulse current of this circuit, larger voltages at point 10 are required. Larger voltages cause a breakdown of SCR 14. Thus the amount of signal that can be generated through laser diode 24 is limited.

Figure 2:
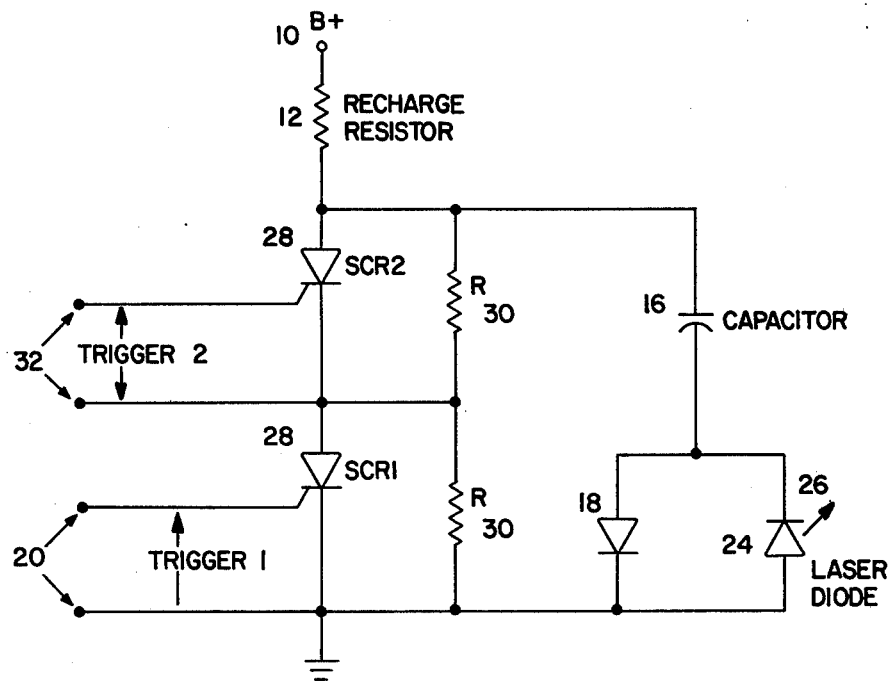
FIG. 2 is a prior art circuit that used two SCRs.

An attempt to solve this problem is shown in FIG. 2. Once again the input voltage 10 is indicated by the B+ point and once again a recharge resistor 12 is shown with a capacitor 16. Components having the same reference numerals in different figures serve the same function each figure. The difference is that there are 2 SCRs labeled 28 and matching resistors labeled 30 connected in the circuit. The purpose of resistors 30 is to divide the input voltage 10 evenly across SCRs 28. Thus ½ B+ appears across each one.

The circuit is triggered by applying a positive pulse to trigger-1 across points 20 and simultaneously another positive pulse to trigger-2 across points 32. These trigger pulses can be supplied by a transformer. Since the SCRs are in series, the circuit is not fully on until both SCRs are fully on. The circuit cannot turn fully on until the slower of the two SCRs turns fully on. Since the SCRs were triggered at the same time, the impedance of the faster SCR has not dropped to its lowest possible value when the slower SCR is turning on. This causes the slower SCR to turn on even slower. In other words, a residual moderate impedance in the faster SCR will increase the RC time constant of the discharge circuit, which will slow down the slower SCR even more. Thus it is difficult to provide a fast rise time in this circuit. The flow rise time in the circuit will keep laser diode 24 from being used as an electronic range gating device. This can also cause over-heating problems as the current is present for a longer time in laser diode 24.

In both FIG. 1 and FIG. 2 recharging of capacitor 16 is achieved through the turning off of the SCRs shown by the current flow dropping to a very small value. What happens is that when capacitor 16 is fully discharged, the only current source left is due to voltage 10. The function of recharge resistor 12 is to limit the current to a value less than the holding current needed to keep the SCRs on. After SCRs 28 turn off, current provided by voltage source 10 begins recharging capacitor 16.

Figure 3:
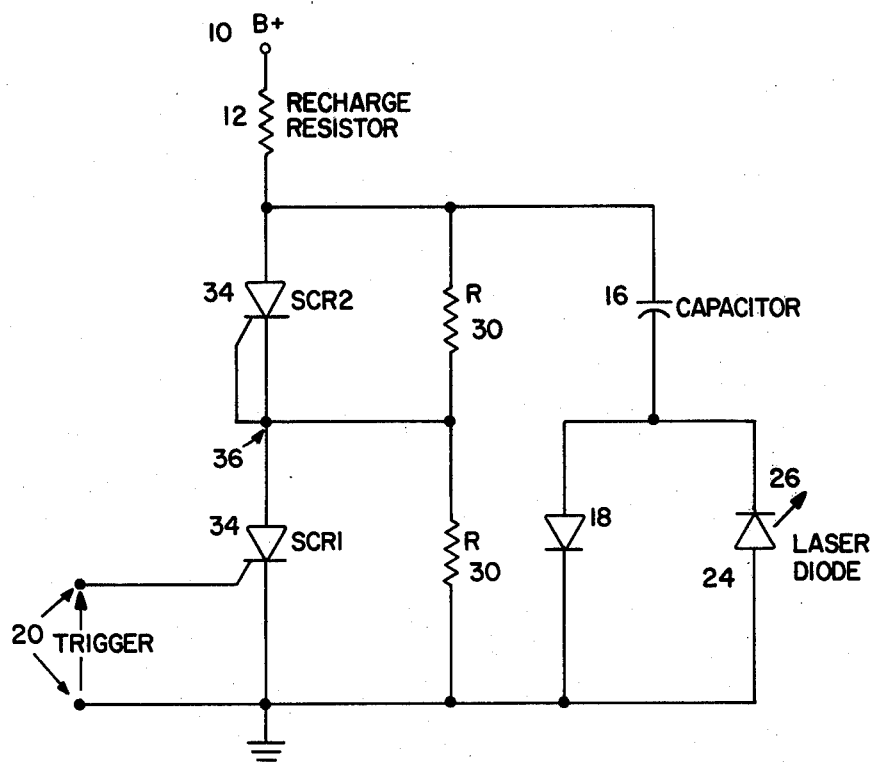
FIG. 3 is a circuit diagram of the present invention.

FIG. 3 is a circuit diagram of the present invention which avoids the problems present in FIGS. 1 and 2. Once again the voltage source 10 is shown with a recharge resistor 12. Voltage source 10 and capacitor 16 will be of pre-determined values dependent on the pulse current desired. Recharge resistor 12 functions as a current control circuit for voltage source 10. The simplest current control circuit is provided by simply making resistor 12 as large as necessary to current below the holding current necessary for the SCRs as previously discussed. Another version of current control circuits which are possible in this position will be shown later.

Resistors 30 again divide the voltage 10 evenly across the two SCRs shown. The SCRs in this circuit are identified by numbers 34 to distinguish that these SCRs are wired differently from those previously shown. The anode of SCR-1 is connected to the cathode and to the gate of SCR-2. The first SCR or SCR-1 is again turned on by a trigger pulse 20 as shown. When SCR-1 is turned on it now acts as a short. Point 36 becomes effectively tied to ground. Since SCR-1 is triggered alone, it turns fully on and its impedance drops to its lowest possible value before SCR-2 can react. Thus, the entire voltage B+ is applied across SCR-2 since point 36 is shorted to ground. The large change of voltage with respect to time or dv/dt is sufficient to provide an alternative mode for turning on SCR-2. The actual voltage at which the SCR turns on in this mode can be less than the breakdown voltage. However, the total voltage, B+, will be higher as its level will be determined by the current desired. The faster turn on time in this mode is due to the high value of dv/dt which takes a very short time to build up to the desired voltage level.

It should be noted that SCRs have 2 trigger modes. The first is a positive signal to the gate, which is what was used in the previous circuitry shown. The second is a rapid increase in voltage across the cathode and anode, which is a significantly faster mode of turn-on for an SCR. Also note that by tying the gate and cathode of SCR-2 together, SCR-2 cannot be gate triggered by noise. SCR-2 still allows current to flow out of the gate after the SCR has been dv/dt triggered. This is the fastest possible configuration for turning on SCR-2. It should be noted that what in the circuit of FIG. 1 was a limitation, i.e. a breakdown voltage problem, is now resolved in FIG. 3 to be an advantage of the method of triggering SCR-2. By using SCR-2 in the faster turn on mode, only one trigger pulse is necessary to initiate the discharge of capacitor 16.

Figure 4:
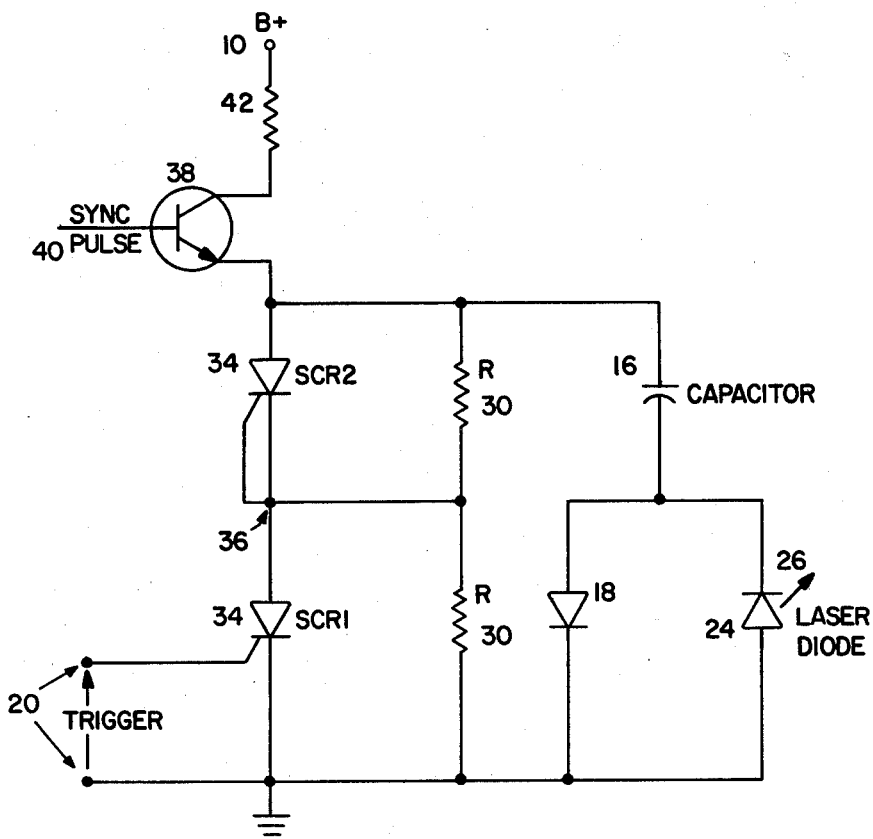
FIG. 4 is an alternative embodiment of the present invention.

FIG. 4 repeats the circuitry shown in FIG. 3 and is therefore labeled with the same numbers wherever appropriate. This circuit adds a transistor 38 which is attached to a pulse source 40 which is synchronized to trigger source 20. In addition it should be noted that what has previously been identified as recharge resistor 12 is now resistor 42. This is another way of having current control circuitry between the voltage source 10 and SCRs 34. Transistor 38 can be driven by a pulse 40 synchronous with trigger pulse 20 so it acts as an on-off switch between voltage source 10 and the rest of the circuitry. Pulse source 40 turns transistor 38 off during the trigger period and for an adequate time after the trigger period so the SCRs have time to turn off. Thus, by no longer having a minimum current always flowing from voltage source 10, voltage source 10 can in effect be disconnected from the circuit insuring turn off by SCRs 34 when capacitor 16 current drops below the holding current. This addition of transistor 38 can provide a faster recharge time on capacitor 16. This is because resistor 42 can now be a significantly smaller resistance than recharge resistor 12 which was used in the other embodiment. Thus once the SCRs 34 are turned off, the lower resistance 42 provides a larger current into capacitor 16, which permits it to charge up faster. Decreasing the recharge time makes it possible to pulse laser diode 24 at a faster rate.

What is claimed is:

1. A modulator for pulsing a semiconductor laser comprising:
    first and second SCR's, each having an anode, a cathode and a gate with said anode of said first SCR connected to said cathode and to said gate of said second SCR;
    means for equalizing the potential difference across said first and second SCRs connected thereto;
    a capacitor connected to said anode of said second SCR;
    a diode having an anode and a cathode, said cathode of said diode connected to said cathode of said first SCR, and said anode of said diode connected to said capacitor to complete the charging circuit therefor so that said capacitor becomes charged when said first and second SCRs are in a nonconducting condition;
    a laser diode having an anode and a cathode, said cathode of said laser diode connected to said capacitor and said anode of said laser diode connected to said cathode of said first SCR so that said capacitor discharges through said laser diode when said first and second SCRs are in a conducting condition;
    a current control circuit comprising:
    a transistor having an emitter, a collector, and a base with said emitter connected to said anode of said second SCR, and
    a resistor connected to said collector;
    means for applying pulses to said base of said transistor to put said transistor in a non-conducting condition when said first SCR is triggered and while said first and second SCRs are in a conducting condition and to put said transistor in a conducting condition after the discharge current from said capacitor drops below the holding current of said first and second SCRs;
    means for applying a potential difference across said resistor in said current control circuit and said cathode of said first SCR; and
    means for supplying trigger signals across said gate and said cathode of said first SCR to cause said first SCR to conduct, causing the potential difference across said anode and said cathode of said second SCR to increase rapidly, whereby said second SCR is caused to conduct.

2. A modulator as described in claim 1 wherein said laser diode emits electromagnetic radiation in the optical region of the spectrum.

3. A modulator as described in claim 1 wherein said laser diode emits electromagnetic radiation in the infrared region of the electromagnetic spectrum.

4. A modulator according to claim 1 wherein said means for equalizing the potential difference across said first and second SCRs comprises:
    a first resistor connected across said anode and said cathode of said second SCR; and
    a second resistor connected across said anode and said cathode of said second SCR.

5. A modulator comprising:
    first and second SCRs, each having an anode, a cathode and a gate with said anode of said first SCR connected to said cathode and to said gates of said second SCR;
    a voltage divider comprising a first resistor connected across said anode and said cathode of said first SCR and a second resistor connected across said anode and said cathode of said second SCR;
    a capacitor connected to said anode of said second SCR;
    a diode having an anode and a cathode, said cathode of said diode connected to said cathode of said first SCR, and said anode of said diode connected to said capacitor to complete the charging circuit therefor so that said capacitor becomes charged when said first and second SCRs are in a non-conducting condition;

a current control circuit comprising:

a transistor having an emitter, a collector, and a base with said emitter connected to said anode of said second SCR, and a resistor connected to said collector;

means for applying pulses to said base of said transistor to put said transistor in a nonconducting condition when said first SCR is triggered and while said first and second SCRs are in a conducting condition and to put said transistor in a conducting condition after the discharge current from said capacitor drops below the holding current of said first and second SCRs;

means for applying a potential difference across said resistor in said current control circuit and said cathode of said first SCR;

means for applying trigger signals across said gate and said cathode of said first SCR to cause first SCR to conduct, causing the potential difference across said anode and said cathode of said second SCR to increase rapidly, whereby said second SCR is caused to conduct; and means for connecting an electrical load to said capacitor to carry current when said capacitor discharges.

* * * * *